(12) United States Patent
Lu et al.

(10) Patent No.: US 11,508,658 B2
(45) Date of Patent: Nov. 22, 2022

(54) SEMICONDUCTOR DEVICE PACKAGE AND METHOD OF MANUFACTURING THE SAME

(71) Applicant: TAIWAN SEMICONDUCTOR MANUFACTURING COMPANY LTD., Hsinchu (TW)

(72) Inventors: Hau-Yan Lu, Hsinchu (TW); Felix Ying-Kit Tsui, Cupertino, CA (US); Jing-Hwang Yang, Hsinchu County (TW); Feng Yuan, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 3 days.

(21) Appl. No.: 16/837,941

(22) Filed: Apr. 1, 2020

(65) Prior Publication Data

US 2021/0313259 A1    Oct. 7, 2021

(51) Int. Cl.
  *H01L 23/528*  (2006.01)
  *H01L 23/00*  (2006.01)
  *H01L 21/311*  (2006.01)
  *H01L 21/3213*  (2006.01)

(52) U.S. Cl.
  CPC ...... *H01L 23/528* (2013.01); *H01L 21/31144* (2013.01); *H01L 21/32139* (2013.01); *H01L 24/45* (2013.01)

(58) Field of Classification Search
  CPC .......... G02B 2006/12147; G02B 27/00; G02B 6/00; G02B 6/0013; G02B 6/0016; G02B 6/0045; G02B 6/0058; G02B 6/0075; G02B 6/0076; G02B 6/24; G02B 6/02052–02195; G02B 5/00; G02F 1/00; H01P 5/227; H01P 5/185; H01L 27/00; H01L 21/00
  See application file for complete search history.

(56) References Cited

U.S. PATENT DOCUMENTS

| 4,815,843 A * | 3/1989 | Tiefenthaler ........... G02B 6/124 385/12 |
| 5,071,248 A * | 12/1991 | Tiefenthaler ....... G02B 6/12007 356/128 |
| 5,434,434 A * | 7/1995 | Kasahara ............ H01L 31/0236 257/85 |
| 9,804,607 B1 * | 10/2017 | Coleman ............... F28F 21/065 |
| 2003/0081878 A1 * | 5/2003 | Joyner ................ H01S 5/06258 385/14 |

(Continued)

*Primary Examiner* — Lawrence C Tynes, Jr.
(74) *Attorney, Agent, or Firm* — WPAT, P.C., Intellectual Property Attorneys; Anthony King

(57) ABSTRACT

The present disclosure provides a semiconductor device package. The semiconductor device package includes a semiconductor substrate having a first surface and a first optical coupler disposed on the first surface of the semiconductor substrate. The first optical coupler includes a first surface facing away from the first surface of the semiconductor substrate and a first lateral surface connected to the first surface of the first optical coupler. The first surface of the first optical coupler and the first lateral surface of the optical coupler define an angle greater than 90 degrees. A method of manufacturing a semiconductor device package is also disclosed.

22 Claims, 15 Drawing Sheets

(56) References Cited

U.S. PATENT DOCUMENTS

| | | | |
|---|---|---|---|
| 2013/0223790 A1* | 8/2013 | Jones | G02B 6/14 |
| | | | 385/14 |
| 2016/0327743 A1* | 11/2016 | Kippenberg | G02B 6/136 |
| 2017/0235219 A1* | 8/2017 | Kostamo | B29C 59/02 |
| | | | 264/40.1 |
| 2017/0299808 A1* | 10/2017 | Zhou | G02B 6/12007 |
| 2017/0336560 A1* | 11/2017 | Boeuf | G02B 6/12004 |

* cited by examiner

SEMICONDUCTOR DEVICE PACKAGE AND METHOD OF MANUFACTURING THE SAME

BACKGROUND

Optical signaling and processing are mainstream techniques for signal transmission and processing, in which optical (photonic) devices usually integrate different optical components to couple light for full-fledged applications. For example, an edge couple may be used for inline coupling, and a grating coupler may be used for vertical coupling mechanism.

Manufacturing of optical devices integrating different optical components may thus include separate operations for forming different optical components.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
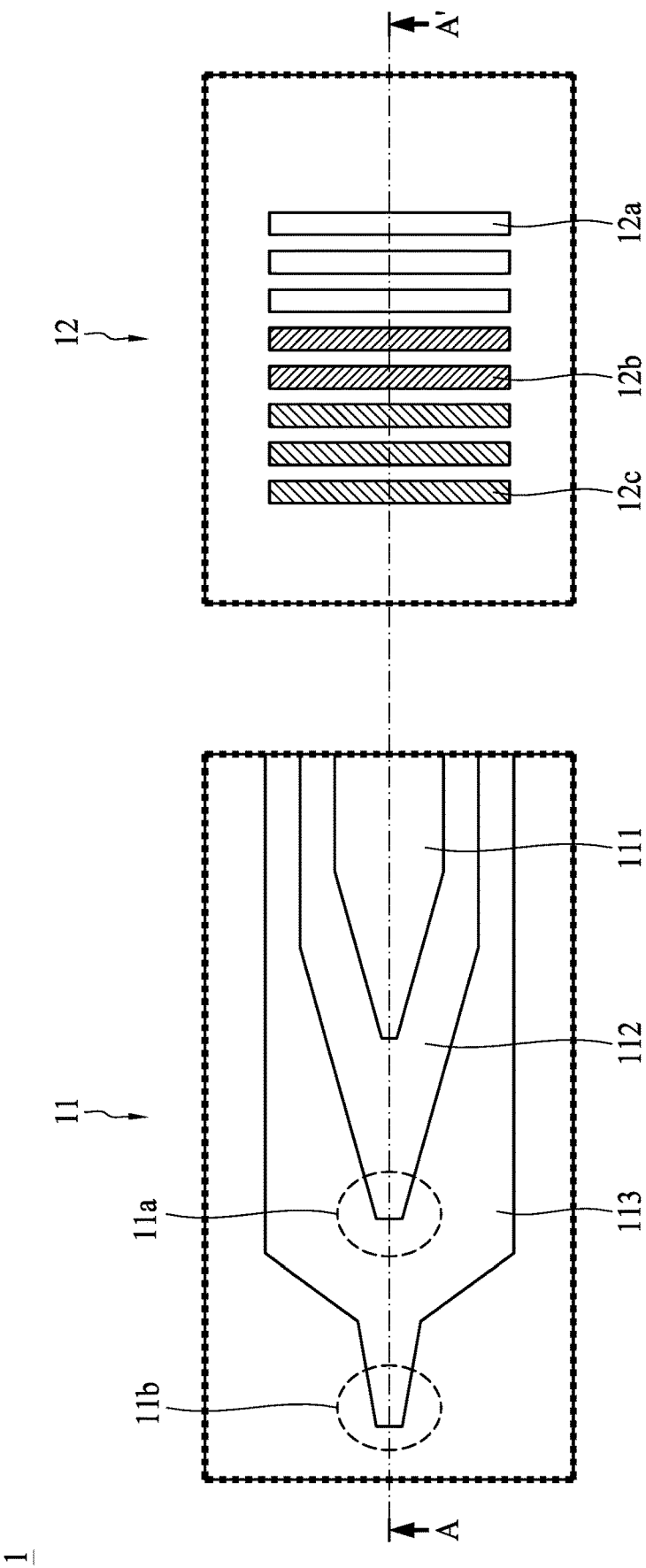
FIG. 1A illustrates a top view of a semiconductor device package in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments, or examples, illustrated in the drawings are disclosed below using specific language, it will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

Figure 1B:
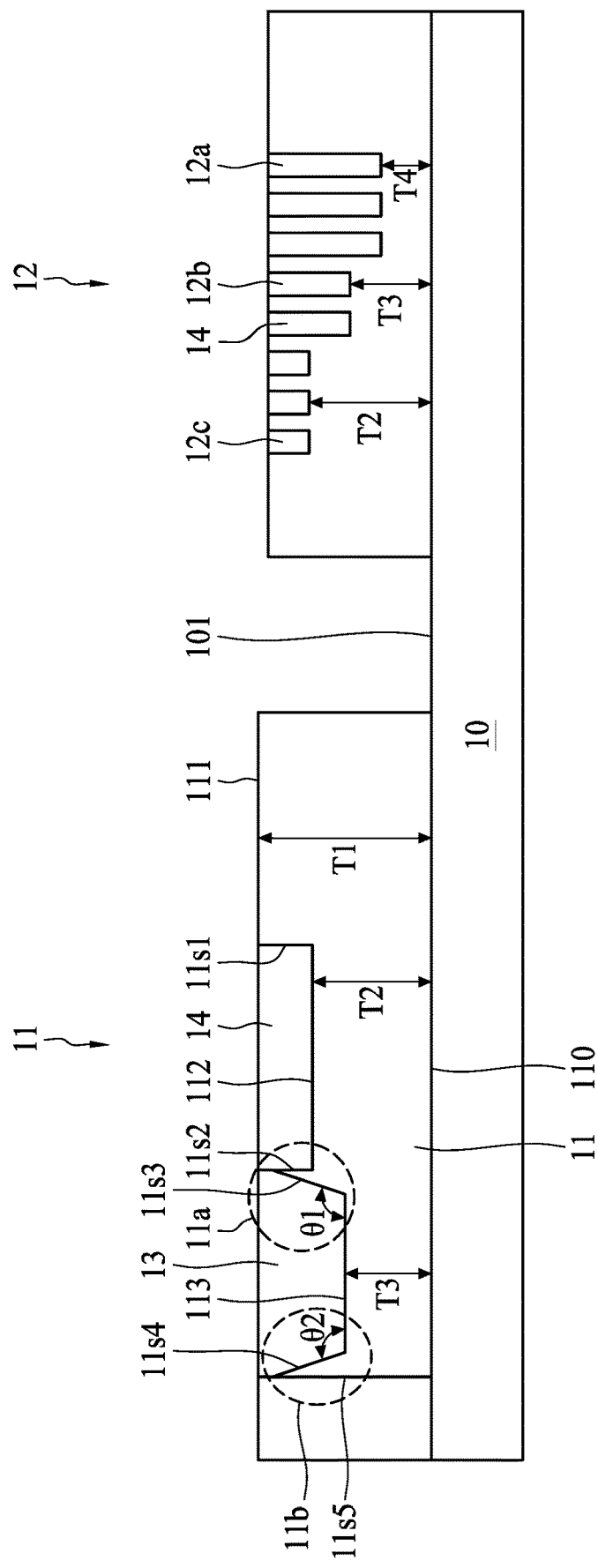
FIG. 1B illustrates a cross-sectional view of a semiconductor device package in accordance with some embodiments of the present disclosure.

Referring to 1A and 1B, FIG. 1A illustrates a top view of a semiconductor device package 1 in accordance with some embodiments of the present disclosure. FIG. 1B illustrates a cross-sectional view of a semiconductor device package in accordance with some embodiments of the present disclosure. In some embodiments, FIG. 1B illustrates a cross-sectional view of the semiconductor device package 1 taken along section line AA' as shown in FIG. 1A.

As shown in FIGS. 1A and 1B, the semiconductor device package 1 includes a semiconductor substrate 10, an optical coupler 11, another optical coupler 12, a hard mask layer 13, and an oxide layer 14, For the purpose of simplicity and clarity, the semiconductor substrate 10, the hard mask layer 13, and the oxide layer 14 are omitted in FIG. 1A.

In some embodiments, the semiconductor device package 1 may include an optical transceiver module. For example, the semiconductor device package 1 may include an electrical junction and optical input/output portion(s) configured to transmit and/or receive optical signals, respectively. The optical signal may be, for example, light, pulsed light, light with Continuous Wave (CW), or a combination thereof. The electrical junction may include a semiconductor device (e.g., a transistor, a capacitor, etc.), wiring elements or conductive elements for electrical connection. The optical input/output portion(s) may include a semiconductor device and optical elements for processing optical signal. For example, the optical input/output portion of the semiconductor device package 1 may include a modulator, a grating coupler, an edge coupler, a waveguide, a filter, or a combination thereof.

In some embodiments, the semiconductor substrate 10 may include a printed circuit board, an interposer, a photonic wafer (e.g., a silicon photonic wafer), or other suitable substrate for an optical transceiver module. In some embodiments, the substrate 10 may include an interconnection structure, such as a redistribution layer (RDL), a grounding element, or other conducting element.

The semiconductor substrate 10 has a surface 101. The optical coupler 11 is disposed on the surface 101 of semiconductor substrate 10. The optical coupler 12 is disposed on the surface 101 of the semiconductor substrate 10 and spaced apart from the optical coupler 12.

In some embodiments, the optical coupler 11 may be configured to couple the optical signal into the optical coupler 12. For example, the optical coupler 11 may include an edge coupler. For example, the optical coupler 12 may include a grating coupler.

In some embodiments, each of the optical couplers 11 and 12 may include a silicon substrate, a silicon-germanium substrate, or another semiconductor substrate. Other substances, such as glass, multi-layered or gradient substrates may also be used. In some embodiments, various operations (such as the operations illustrated in FIGS. 2A through 2N, which will be further discussed later) can be performed to form optical devices such as a modulator, a grating coupler, an edge coupler, a waveguide, a filter, or a combination thereof in the substrate.

Still referring to FIGS. 1A and 1B, the optical coupler 11 includes a surface 110 facing the surface 101 of the semiconductor substrate 10. On the opposite side, the optical coupler 11 further includes a surface 111, a lateral surface 11s1, a surface 112, a lateral surface 11s2, a lateral surface 11s3, a surface 113, a lateral surface 11s4, and a lateral surface 11s5, The surface 111, the surface 112, and the surface 113 face away from the surface 101 of the semiconductor substrate 10.

As can be seen from the top view of FIG. 1A, the surface 111, the surface 112, and the surface 113 define three areas of the optical coupler 11. The area defined by the surface 113 surrounds the area defined by the surface 112. The area defined by the surface 112 surrounds the area defined by the surface 111.

In some embodiments, the central lines of the surface 113, 112, and 111 are illustrated by the section line AA', in other words, the central line of the surface 113 is aligned with the central line of the surface 112.

In some embodiments, the central lines of the surface 113, 112, and 111 pass through the center (such as a symmetric center) of the optical coupler 11. In some embodiments, the central lines of the surface 113, 112, and 111 are axis of symmetry of the optical coupler 11.

In some embodiments, the central lines of the surface 113, 112, and 111 pass through the center (such as a symmetric center) of tip portions 11a and 11b. In some embodiments, the central lines of the surface 113, 112, and 111 are axis of symmetry of the tip portions 11a and 11b.

In some embodiments, the central lines of the surface 113, 112, and 111 are defined on an imaginary plane substantially parallel to the surface 101 of the semiconductor substrate 10.

In some embodiments, the critical dimensions of the surfaces 113 and 112 (such as the critical dimensions of the tip portions 11a and 11b) are defined by the same one photomask or reticle (such as the operation illustrated in FIG. 2A), and thus, the center lines of the surfaces 113 and 112 can be aligned. In some embodiments, there is no misalignment between the surfaces 113 and 112, or the misalignment there between may be less than 10 nanometers (am), or less.

In a comparative embodiment, the critical dimensions of the surfaces 113 and 112 may be defined by more than one photomask. For example, the positions of the tip portions 11a and 11b are defined by different photomasks in different developing operations. In such an embodiment, the center line of the surface 113 and the center line of the surface 112 may space apart from each other by a distance greater than 5 nm, such as 10 nm, 30 nm, or more.

As can be seen from the cross-sectional view of FIG. 1B, the surface 111, the surface 112, and the surface 113 are at different elevations or heights. For example, the distance (annotated as "T1") between the surface 110 and the surface 111, the distance (annotated as "T2") between the surface 110 and the surface 112, and the distance (annotated as "T3") between the surface 110 and the surface 113 are different. For example, the distance T1 may range from about 245 nm to about 295 nm. For examples, the distance T2 may range from about 180 nm to about 230 nm. For examples, the distance T3 may range horn about 110 nm to about 160 nm.

The surface 111 is connected to the surface 112 through the lateral surface 11s1. The surface 112 is connected to the surface 113 through the lateral surface 11s2 and the lateral surface 11s3. The surface 113 is connected to the lateral surface 11s5 through the lateral surface 11s4.

The lateral surface 11s1, the surface 112, and the lateral surface 11s2 define a cavity accommodating the oxide layer 14. The lateral surface 11s3, the surface 113, and the lateral surface 11s4 define a cavity accommodating the hard mask layer 13.

The lateral surface 11s2 and the lateral surface 11s3 define the tip portion 11a protruding from the surface 112 and the surface 113. The lateral surface 11s4 and the lateral surface 11s5 define the tip portion 11b protruding from the surface 113.

The lateral surface 11s2 of the tip portion 11a is substantially perpendicular to the surface 112. The lateral surface 11s3 of the tip portion 11a is slanted with respect to the surface 113. For example, the lateral surface 11s3 and the surface 113 define an angle (annotated as "θ1") greater than 90 degrees.

The lateral surface 11s5 of the tip portion 11b is substantially perpendicular to the surface 113. The lateral surface 11s4 of, the tip portion 11a is slanted with respect to the surface 113. For example, the lateral surface 11s4 and the surface 113 define an angle (annotated as "θ2") greater than 90 degrees.

As shown in FIG. 1B, the cavity defined by the lateral surface 11s3, the surface 113, and the lateral surface 11s4 has an inverted trapezoid shape. The width of the opening is greater than the width of the bottom.

In the manufacturing of the semiconductor device package 1, the lateral surface 11s3 and the lateral surface 11s4 are protected by the hard mask layer 13 from being etched away, forming the tip portion 11a and the tip portion 11b.

The hard mask layer 13 is disposed on the surface 113 and in contact with the lateral surface 11s4, the surface 113, and the lateral surface 11s3.

The oxide layer 14 is disposed on the surface 112 and in contact with the lateral surface 11s2, the surface 112, and the lateral surface 11s1

In some embodiments, the top surface of the hard mask layer 13 is substantially coplanar with the top surface of the oxide layer 14. In some embodiments, the top surface of the oxide layer 14 is substantially coplanar with the surface 111 of the optical coupler 11.

In some embodiments, the hard mask layer 13 may include silicon nitride, silicon oxynitride, silicon carbide, or other suitable material. In some embodiments, the oxide layer 14 may include silicon oxide, tetraethylorthosilicate (TEOS) oxide, or other suitable material.

The optical coupler 12 includes trenches 12a, 12b, and 12c. The trenches 12a, 12b, and 12c are filled with the oxide layer 14.

As can be seen from the cross-sectional view of FIG. 1B, the trenches 12a, 12b, and 12c have different depths. For examples, the trench 12a has a bottom surface spaced apart from the surface 101 by a distance (annotated as "T4"). The trench 12b has a bottom surface spaced apart from the surface 101 by a distance (annotated as "T3"). The trench 12c has a bottom surface spaced apart from the surface 101 by a distance (annotated as "T2").

In some embodiments, as mentioned, the distance 12 may be range from about 180 nm to about 230 nm, and the distance 13 may be range from about 110 nm to about 160 nm. In some embodiments, the distance T4 may be range from about 40 nm to about 90 nm.

Although there are three top surfaces (such as the surfaces 111, 112, and 113) defining three areas of the optical coupler 11, the present disclosure is not limited thereto. In some embodiments, the number of the top surfaces of the optical coupler 11 can be adjusted according to design requirements. In addition, the respective elevations of the top surfaces of the optical coupler 11 can be adjusted according to design requirements.

Although there are three trenches (such as the trenches 12a, 12b, and 12c) in the optical coupler 12, the present disclosure is not limited thereto. In some embodiments, the number of the trenches of the optical coupler 12 can be adjusted according to design requirements. In addition, the respective depths of the trenches of the optical coupler 12 can be adjusted according to design requirements.

Figure 1C:
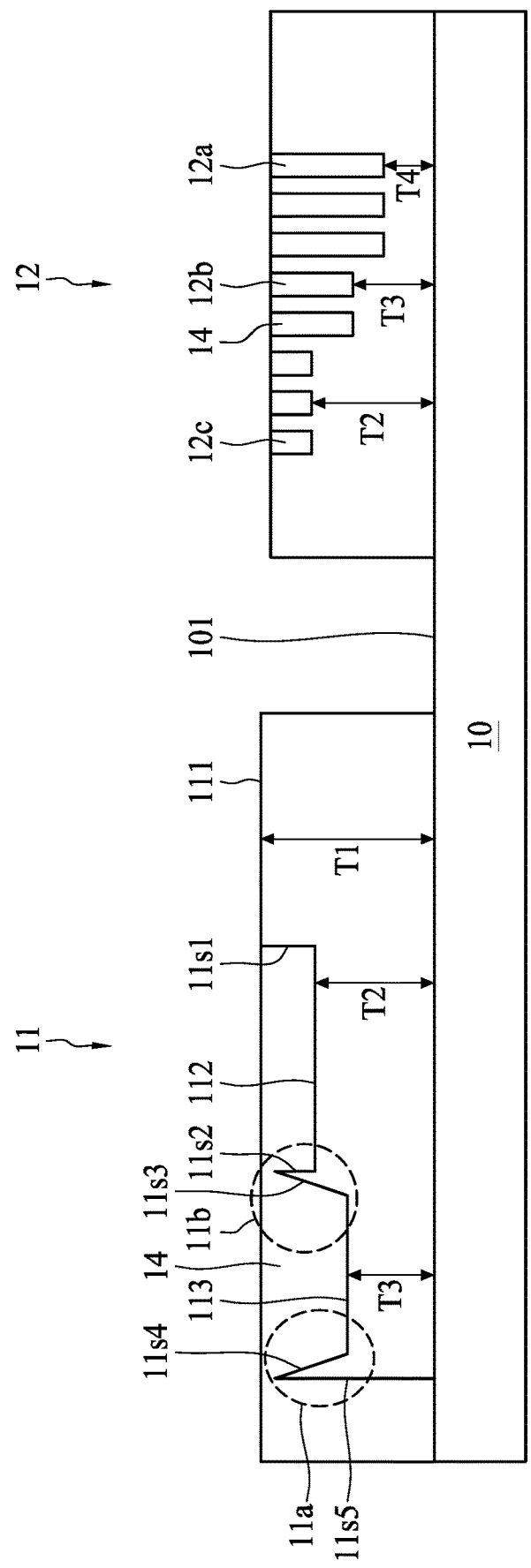
FIG. 1C illustrates a cross-sectional view of a semiconductor device package in accordance with some embodiments of the present disclosure.

FIG. 1C illustrates a cross-sectional view of a semiconductor device package in accordance with some embodiments of the present disclosure. In some embodiments, FIG. 1C illustrates a cross-sectional view of the semiconductor device package 1 taken along section line AA' shown in FIG. 1A. The semiconductor device package in FIG. 1C is similar to the semiconductor device package in FIG. 1B, and the differences therebetween are described below.

The semiconductor device package in FIG. 1C is exclusive of the hard mask layer 13 as shown in FIG. 1B. In some embodiments, the hard mask layer 13 may be removed in an etching operation (such as an operation subsequent to the operation illustrated in FIG. 2M, which will be further discussed later). The oxide layer 14 is disposed in the cavity defined by the lateral surface 11s4, the surface 113, and the lateral surface 11s3.

In some embodiments, a surface roughness of the surface 113 is greater than a surface roughness of the surface 112. For example, the interface between the oxide layer 14 and the surface 113 is substantially rougher than the interface between the oxide layer 14 and the surface 112.

FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L, FIG. 2M, and FIG. 2N, are cross-sectional views of a semiconductor device package at various stages of fabrication, in accordance with some embodiments of the present disclosure. At least some of these figures have been simplified for a better understanding of the aspects of the present disclosure.

Figure 2A:
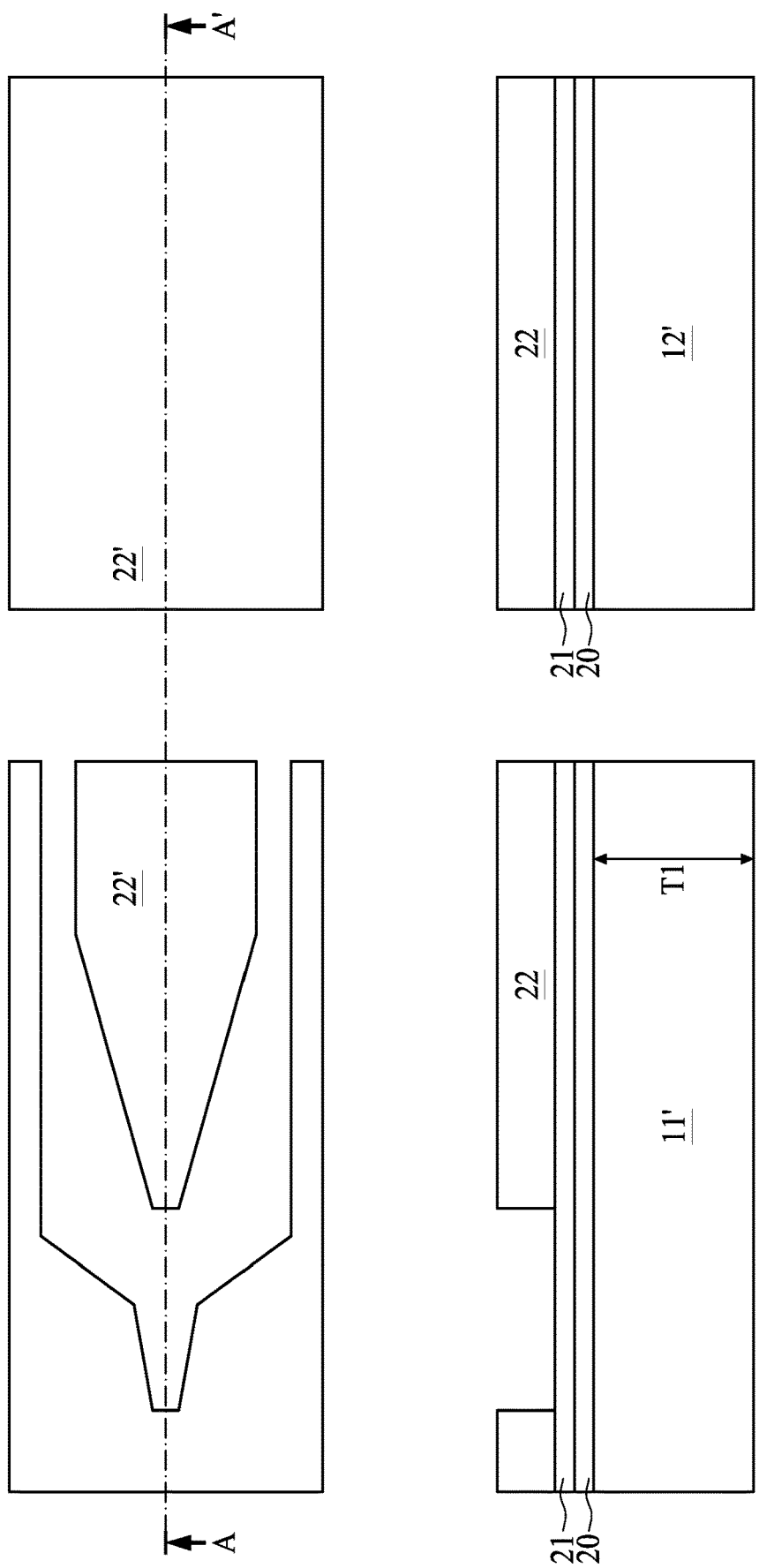
FIGS. 2A through 2N illustrate one or more stages of a method of manufacturing a semiconductor device package in accordance with some embodiments of the present disclosure.

Referring to FIG. 2A, substrates 11' and 12' are provided. In some embodiments, the optical coupler 11 is to be formed in the substrate 11' and the optical coupler 12 is to be formed in the substrate 12'. In some embodiments, the substrate 11' and the substrate 12 are portions of a bulk of substrate, and are connected with each other through the other portion of the substrate. In some embodiments, the substrate 11' and the substrate 12' are physically separated, and are disposed on a carrier (not shown in the figures). In some embodiments, the substrate 11' and the substrate 12' may have a thickness T1.

As shown in FIG. 2A, an etch stop layer (which can also be referred to as a liner or a barrier) 20, a hard mask layer 21, and a photoresist layer 22 are disposed on the substrates 11' and 12'. The top view in the FIG. 2A illustrate a photomask or a reticle 22'. The photoresist layer 22 is patterned through the reticle 22'. The reticle 22' defines the critical dimensions of the surfaces 113 and 112. (such as the critical dimensions of the tip portions 11a and 11b) as shown in FIGS. 1A and 1B.

In some embodiments, the etch stop layer 20 may include a metal nitride, a metal carbide, a metal oxide, or other suitable materials, wherein the metal may include aluminum (Al), manganese (Mn), Copper (Cu), or the combination thereof.

In some embodiments, the etch stop layer 20 may include silicon carbide, silicon nitride, silicon oxynitride, silicon carbo-nitride, or other suitable materials. The etch stop layer 20 is formed of a material that has a relatively high etching selectivity with respect to the overlying hard mask layer 21, and hence the etch stop layer 20 may be used to stop the etching (such as the operation illustrated in FIG. 2D) of the hard mask layer 21.

In some embodiments, the hard mask layer 21 may be a single layer structure and the material of the hard mask layer 21 may be silicon oxide, silicon nitride, silicon oxynitride, TEOS, or other suitable material. In some embodiments, the hard mask layer 21 may be a multi-layered structure and include a plurality of stacked dielectric layers. In some embodiments, an advanced patterning film (APF) and/or a bottom anti-reflective coating (BARC) may be formed on the hard mask layer 21 to aid in a lithographic operation to pattern the overlying photoresist layer 22.

Figure 2B:
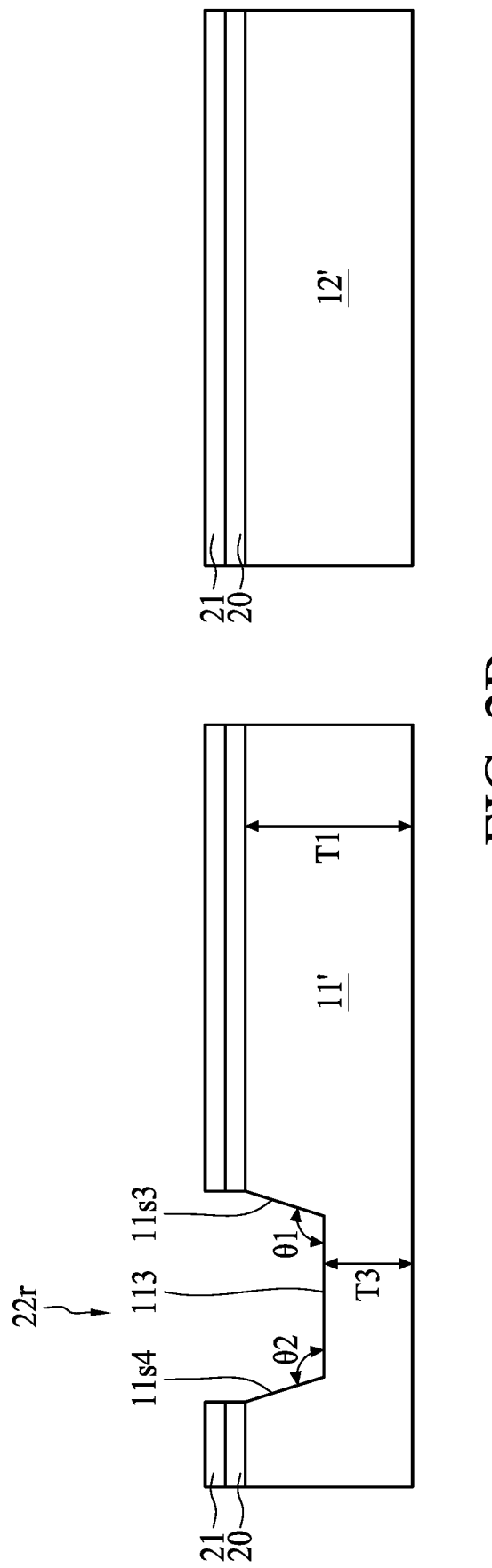

Referring to FIG. 2B, a cavity or a recessing portion 22r is formed in the substrate 11' after a lithographic operation is performed.

In some embodiments, photolithography techniques are utilized to pattern the photoresist layer 22. Generally, the photoresist layer 22 is irradiated (exposed) to energy, e.g. light, through the reticle 22' in order to induce a reaction in those portions of the photoresist layer 22 exposed to the energy. The photoresist layer 22 is developed to remove a portion of the photoresist layer 22, wherein the remaining photoresist layer 22 protects the underlying material from subsequent operation, such as an etching operation.

In some embodiments, the etching operation includes an isotropic wet etching process. In some embodiments, the etchant used for the isotropic wet etching process may include a dilute mixture of hydrofluoric acid (HF) (e.g., 49% HF in $H_2O$ by weight) and de-ionized (DI) $H_2O$, where the HF:$H_2O$ ratio is approximately 1:50, approximately 1:100, or other suitable ratio. Alternatively, in some embodiments, the etching process may include a dry etching process or a combination of a dry/wet etching process.

After the etching operation, the photoresist layer 22 may be removed, for example, by way of a solvent, resist stripper, ashing, or other suitable technique.

In some embodiments, a portion of the substrate 11' exposed from the etch stop layer 20 and the hard mask layer 21 is etched from the thickness T1 to a thickness "T3".

As shown in FIG. 2B, the cavity 22r has lateral surfaces 11s3 and 11s4, and a surface 113. The lateral surface 11s3 is slanted with respect to the surface 113. The lateral surface 11s4 is slanted with respect to the surface 113. The lateral surface 11s3 and the surface 113 define an angle θ1 greater than 90 degrees. The lateral surface 11s4 and the surface 113 define an angle θ2 greater than 90 degrees.

In some embodiments, although not illustrated in the figures, the etch stop layer 20 and the hard mask layer 21 may be slanted with respect to the surface 113.

Figure 2C:
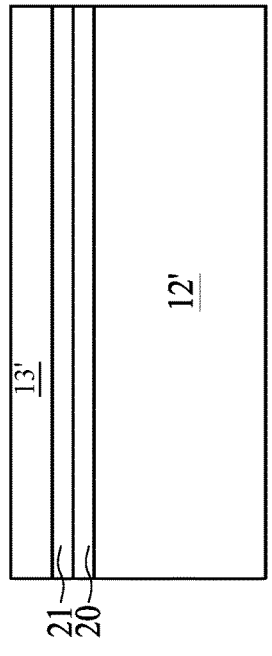
Figure 2C:
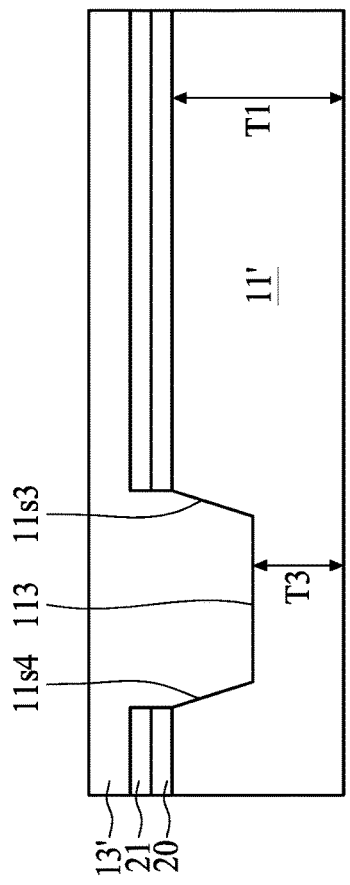

Referring to FIG. 2C, a material of a hard mask is deposited in the cavity 221. The material of the hard mask is also deposited on the hard mask layer 21, forming a hard mask layer 13'.

In some embodiments, the material of the hard mask may include those listed above for the hard mask layer 21. In some embodiments, the hard mask layer 21 and the hard mask layer 13' may include the same material. In some embodiments, the hard mask layer 21 and the hard mask layer 13' may include different materials.

In some embodiments, the hard mask layer 13' may be deposited by a chemical vapor deposition (CVD) process, a plasma-enhanced CVD (PECVD) process, a subatmospheric CVD (SACVD) process, a flowable CVD process, an atomic layer deposition (ALD) process, a physical vapor deposition (PVD) process, or other suitable process.

Figure 2D:
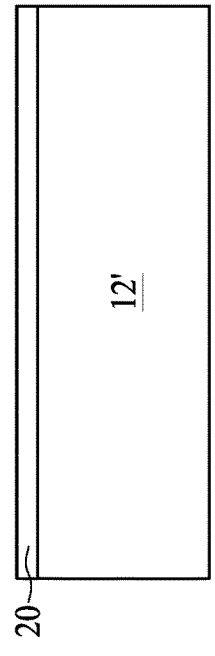
Figure 2D:
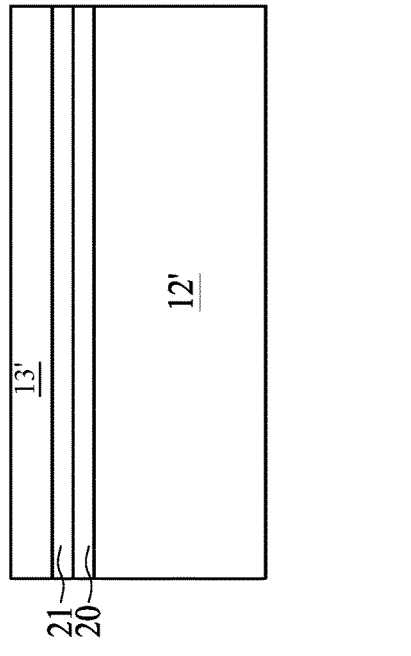

Referring to FIG. 2D, a planarization operation is performed to removed portions of the hard mask layer 13' and the hard mask layer 21 overlying the etch stop layer 20. In some embodiments, the planarization operation may include a chemical mechanical planarization (CMP) process. The planarization operation may remove the hard mask layer 13' and the hard mask layer 21 overlying the etch stop layer 20 to expose the etch stop layer 20. The planarization operation may planarize a top surface of the hard mask layer 13', and forming the hard mask layer 13. The hard mask layer 13 has a top surface substantially coplanar with a top surface of the etch stop layer 20.

Figure 2E:
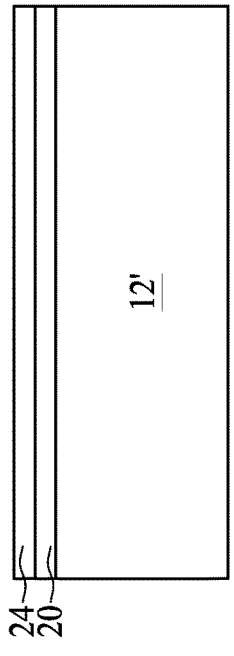
Figure 2E:
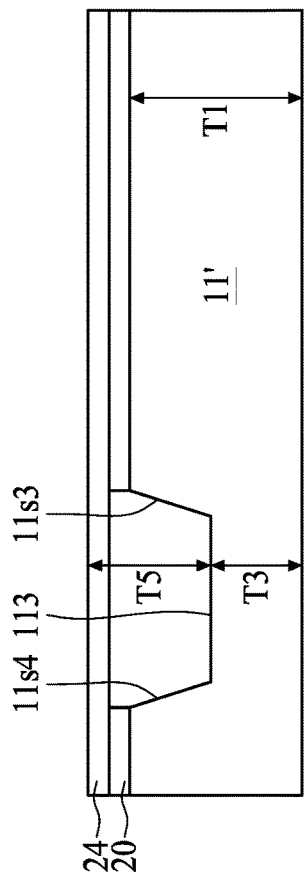

Referring to FIG. 2E, a material of a hard mask is deposited on the hard mask layer 13 and the etch stop layer 20, forming a hard mask layer 24. In some embodiments, the material of the hard mask layer 24 may include those listed above for the hard mask layer 21. In some embodiments, the hard mask layer 24 and the hard mask layer 13 may include the same material. In some embodiments, the hard mask layer 24 and the hard mask layer 13 may include different materials.

In some embodiments, the hard mask layer 24 may be deposited by a CVD process, a PECVD process, a SACVD process, a flowable CVD process, an ALD process, a PVD process, or other suitable process. In some embodiments, a planarization operation may be performed to planarize a top surface of the hard mask layer 24.

In some embodiments, the thickness of the hard mask layer 13 and the thickness of the hard mask layer 24 may be about 250 nm to about 350 nm. For example, the distance (annotated as "T5") from the surface 113 to the top surface of the hard mask layer 24 ranges about 275 nm to about 325 nm.

Figure 2F:
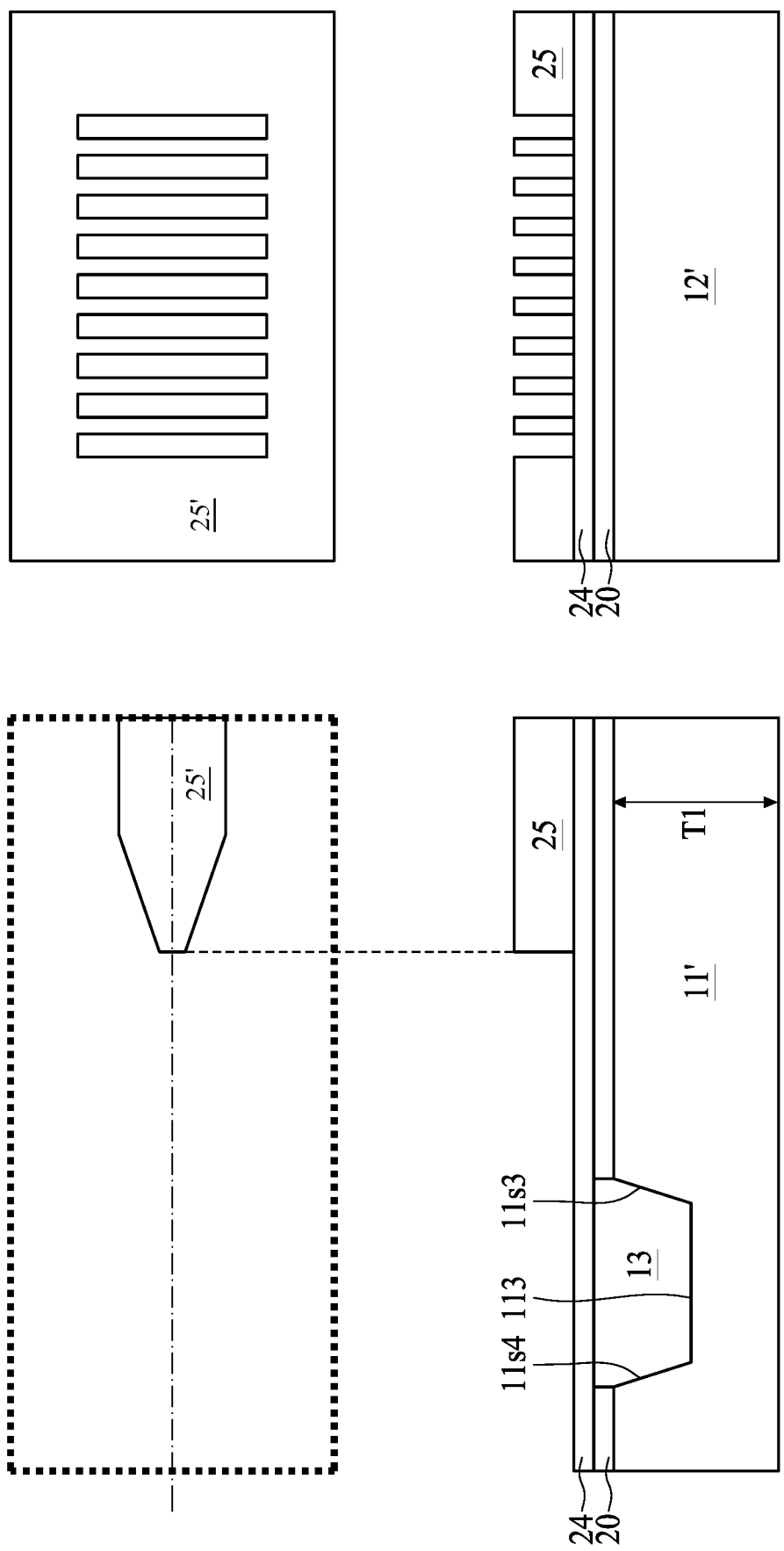

Referring to FIG. 2F, a photoresist layer 25 is formed on the hard mask layer 24. In some embodiments, the photoresist layer 25 may be formed by, for example, spin-on coating. The photoresist layer 25 is patterned through the reticle 25'.

The photoresist layer 25 is patterned to define the critical dimensions of the surface 112 of the optical coupler 11. The photoresist layer 25 is also patterned to define the critical dimensions of the trenches of the optical coupler 12.

Figure 2G:
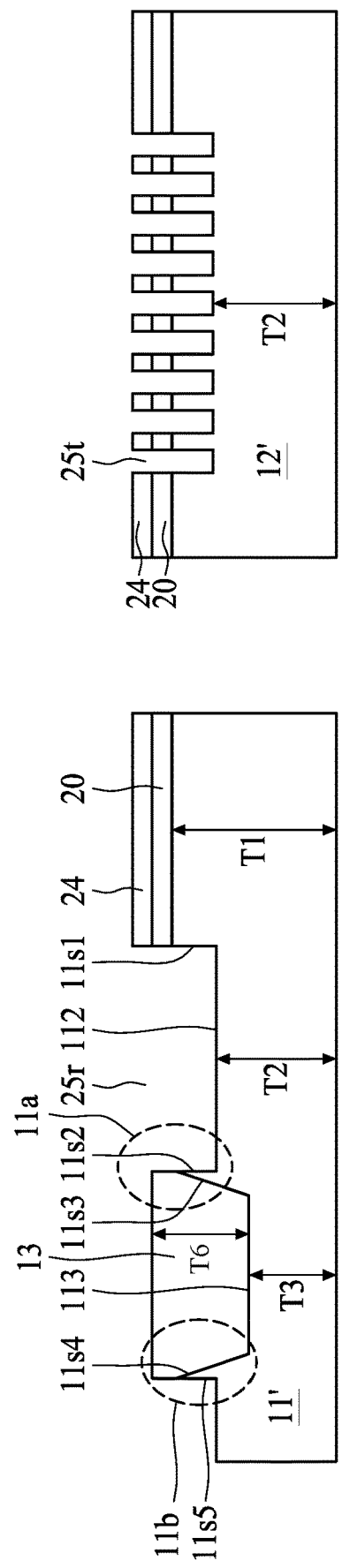

Referring to FIG. 2G, a cavity or a recessing portion 25r is formed in the substrate 11' and a trench 25t is formed in the substrate 12' after a lithographic operation is performed. As mentioned, in some embodiments, photolithography techniques are utilized to pattern the photoresist layer 25. The remaining photoresist layer 25 protects the underlying material from subsequent operation, such as an etching operation.

Portions of the substrate 11', which are exposed from the photoresist layer 25 and the hard mask layer 13, are etched to a thickness T2. The hard mask layer 13 overlying the surface 113 has a thickness T6 between about 105 nm and about 155 urn.

The cavity 25r has lateral surfaces (or sidewalls) 11s1 and 11s2, and a surface (or bottom surface) 112. The lateral surface 11s1 is substantially perpendicular to the surface 112. The lateral surface 11s2 is substantially perpendicular to the surface 112.

The hard mask layer 13 protects the surface 11s3 and the surface 11s4 from being etched, forming the tip portions 11a and 11b.

Portions of the substrate 12', which are exposed from the photoresist layer 25, are etched to a thickness T2, forming the trench 25t in the substrate 12'.

In the operation illustrated in FIG. 2G, the critical dimensions of the surface 112 of the optical coupler 11 and the critical dimensions of the trenches (such as the trenches 12a, 12b, and 12c) of the optical coupler 12 are defined in one lithographic operation.

Figure 2H:
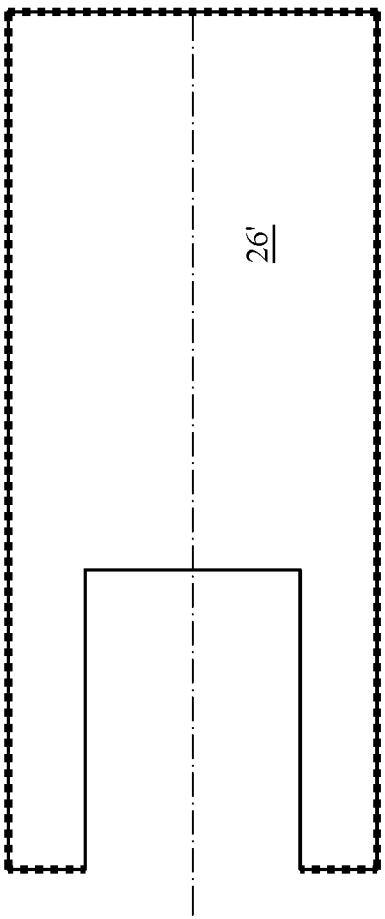
Figure 2H:
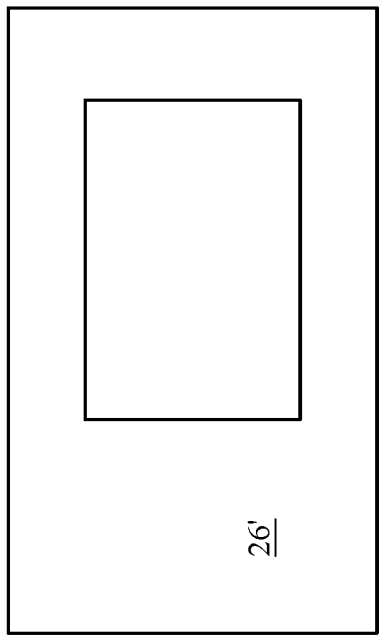
Figure 2H:
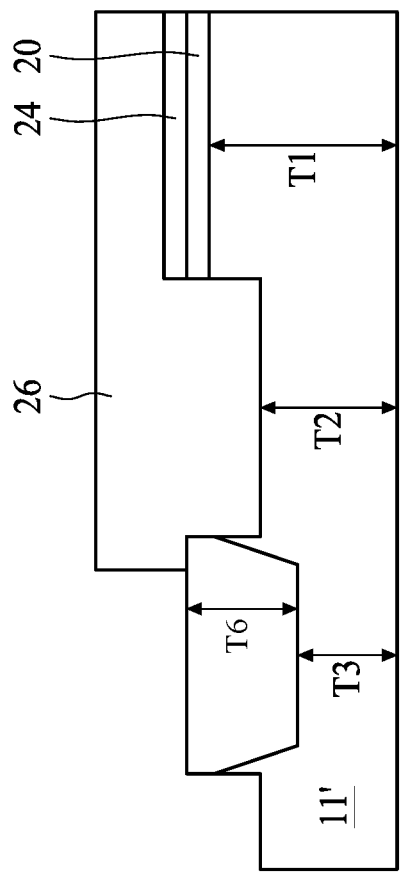
Figure 2H:
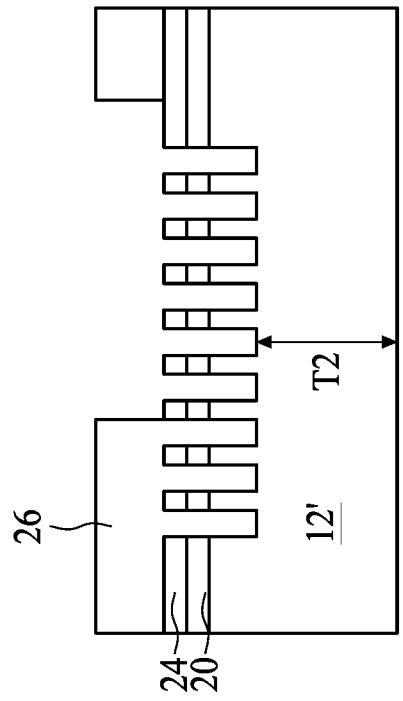

Referring to FIG. 2H, a photoresist layer 26 is formed on the hard mask layer 24. In some embodiments, the photoresist layer 26 may be formed by, for example, spin-on coating. The photoresist layer 26 is patterned through the reticle 26'.

The photoresist layer 26 is patterned to define the critical dimensions of the surface 113 of the optical coupler 11. The photoresist layer 26 is also patterned to define the critical dimensions of the trenches of the optical coupler 12.

Figure 2I:
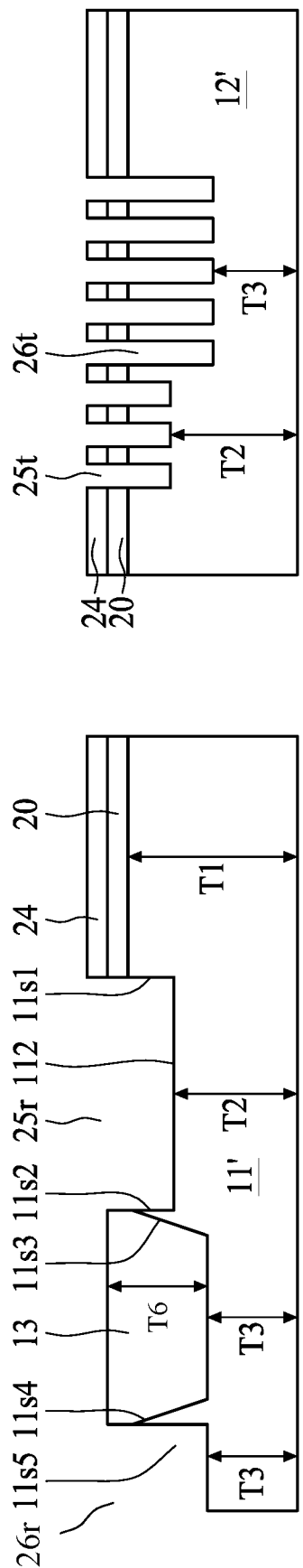

Referring to FIG. 2I, a cavity or a recessing portion 26r is formed in the substrate 11' and a trench 26t is formed in the substrate 12' after a lithographic operation is performed. As mentioned, in some embodiments, photolithography, techniques are utilized to pattern the photoresist layer 26. The remaining photoresist layer 26 protects the underlying material from subsequent operation, such as an etching operation.

Portions of the substrate 11', which are exposed from the photoresist layer 26 and the hard mask layer 13, are etched to a thickness T3.

Portions of the substrate 12', which are exposed from the photoresist layer 26, are etched to a thickness T3, forming the trench 26t in the substrate 12'.

In some embodiments, the trench 26t may be formed by any suitable method. For example, the trench 26t may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

In the operation illustrated in FIG. 2I, the critical dimensions of the surface 113 of the optical coupler 11 and the critical dimensions of the trenches (such as the trenches 12a, 12b, and 12c) of the optical coupler 12 are defined in one lithographic operation.

Figure 2J:
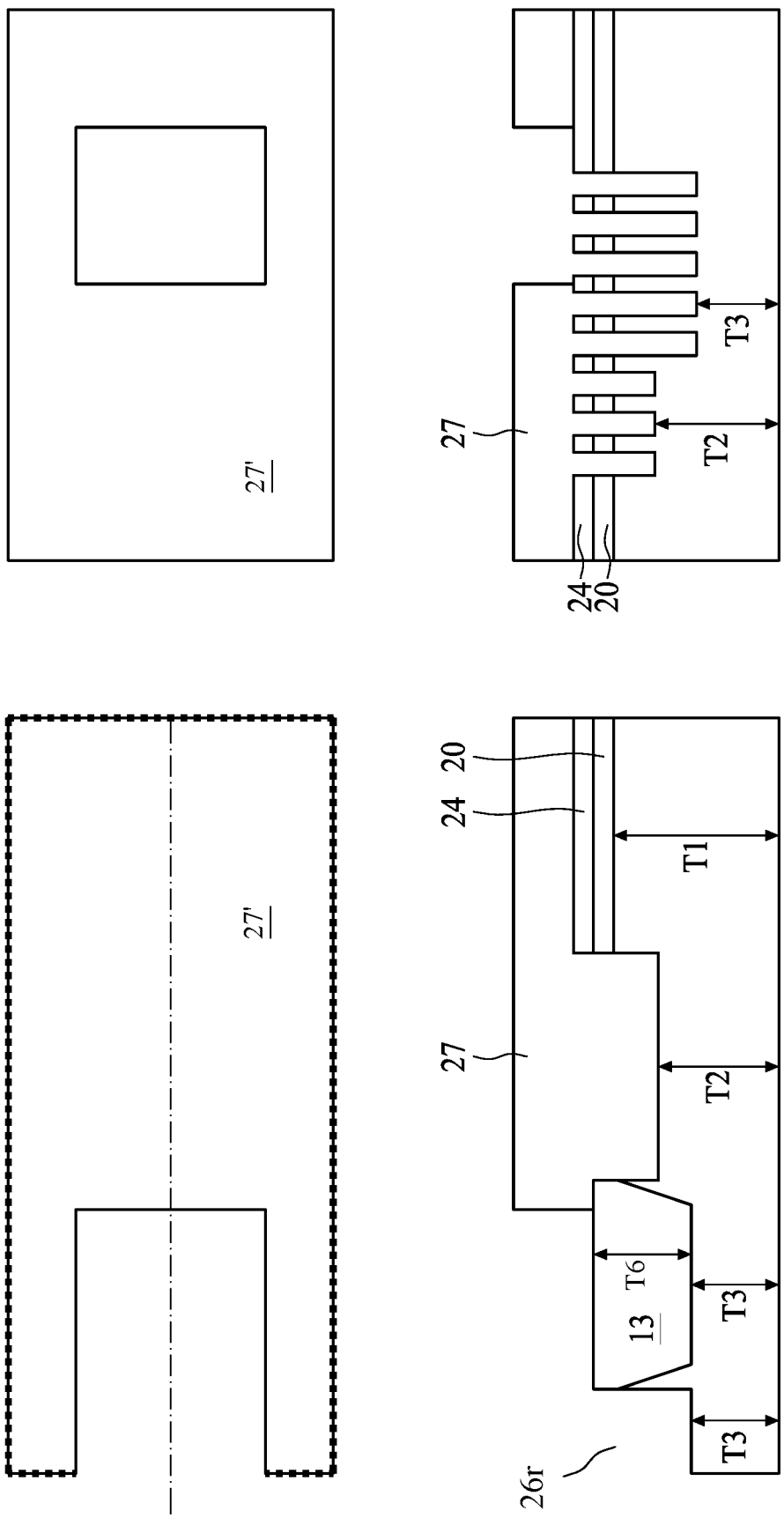

Referring to FIG. 2J, a photoresist layer 27 is formed on the hard mask layer 24. In some embodiments, the photoresist layer 27 may be formed by, for example, spin-on coating. The photoresist layer 27 is patterned through the reticle 27'.

The photoresist layer 27 is patterned to define the critical dimensions of the surface 113 of the optical coupler 11. The photoresist layer 27 is also patterned to define the critical dimensions of the trenches of the optical coupler 12.

Figure 2K:
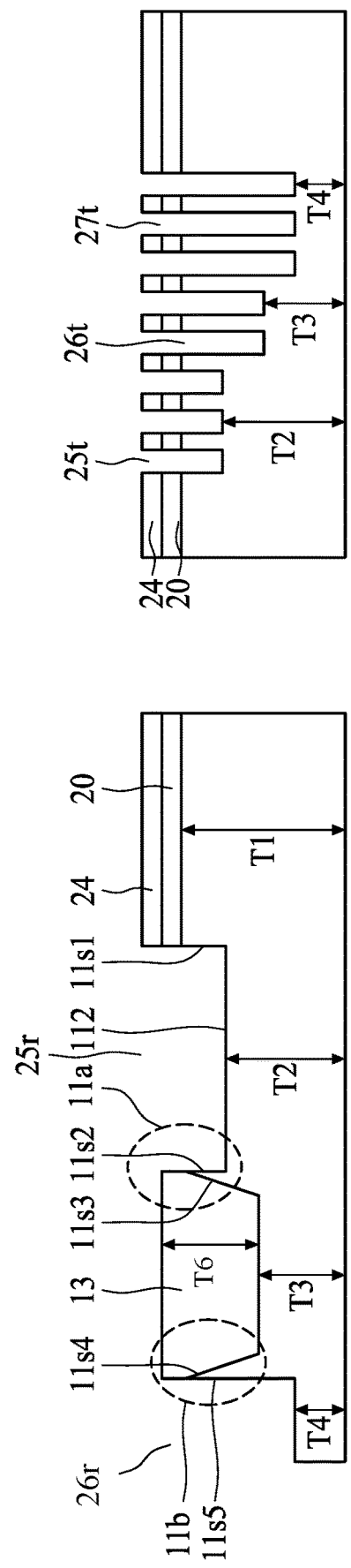

Referring to FIG. 2K, the cavity 26r is etched to a thickness T4. Portions of the substrate 12', which are exposed from the photoresist layer 27, are etched to the thickness T4, forming the trench 27t in the substrate 12'.

In some embodiments, the trench 27t may be formed by any suitable method. For example, the trench 27t may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

In the operation illustrated in FIG. 2K, the critical dimensions of the surface 113 of the optical coupler 11 and the critical dimensions of the trenches (such as the trenches 12a, 12b, and 12c) of the optical coupler 12 are defined in one lithographic operation.

Figure 2L:
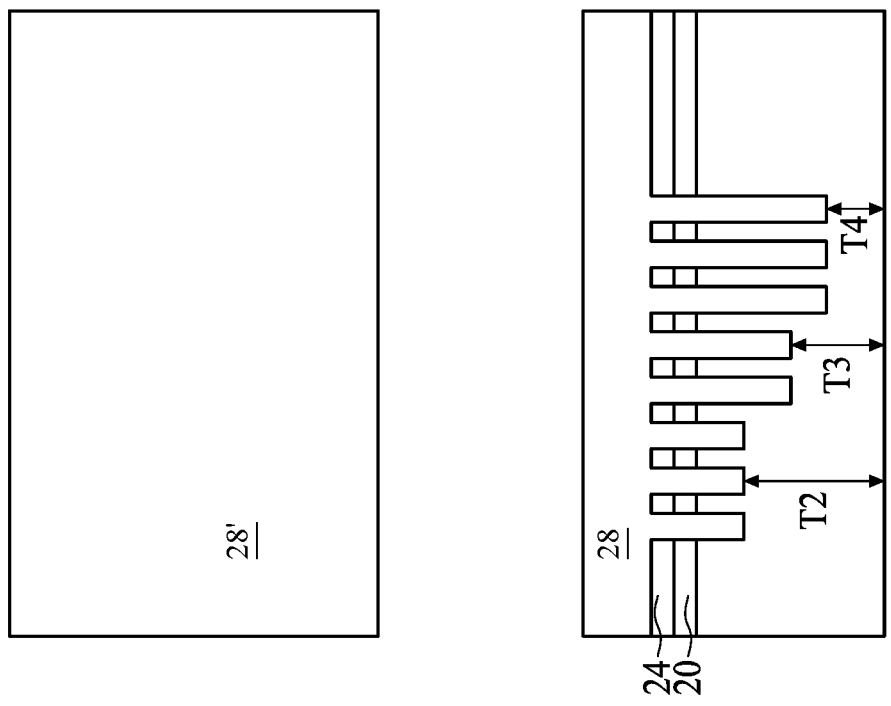
Figure 2L:
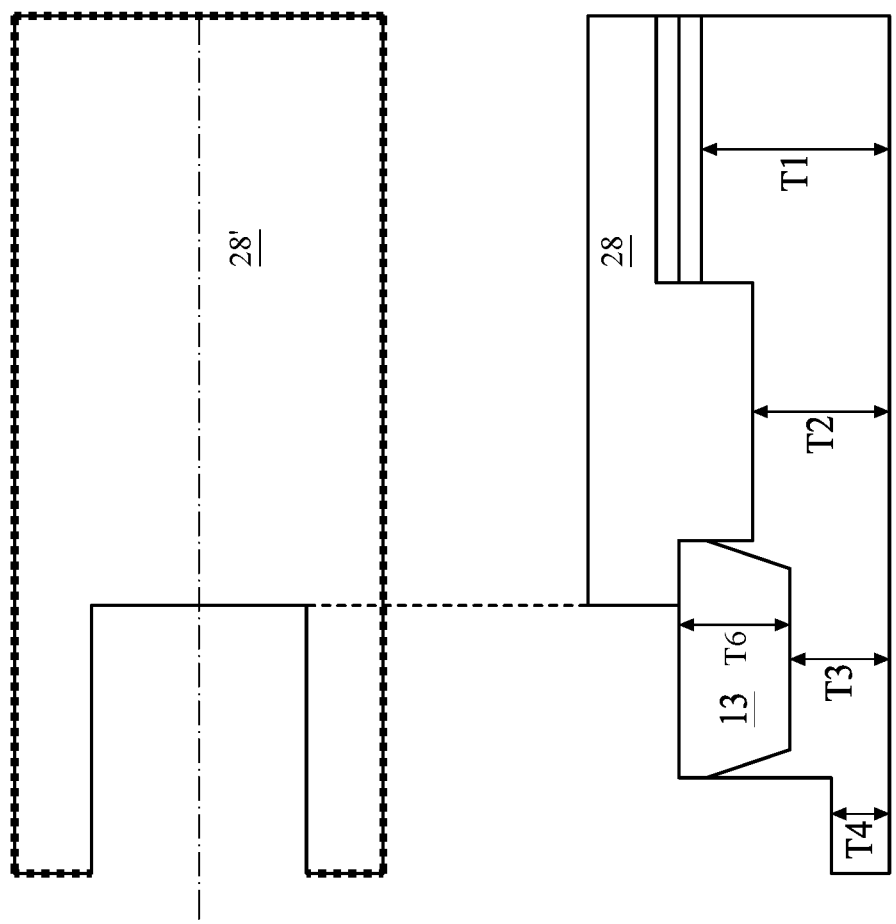

Referring to FIG. 2L, a photoresist layer 28 is formed on the hard mask layer 24. In some embodiments, the photoresist layer 28 may be formed by, for example, spin-on coating. The photoresist layer 28 is patterned through the reticle 28'.

The photoresist layer 28 is patterned to define the critical dimensions of the surface 113 of the optical coupler 11.

Figure 2M:
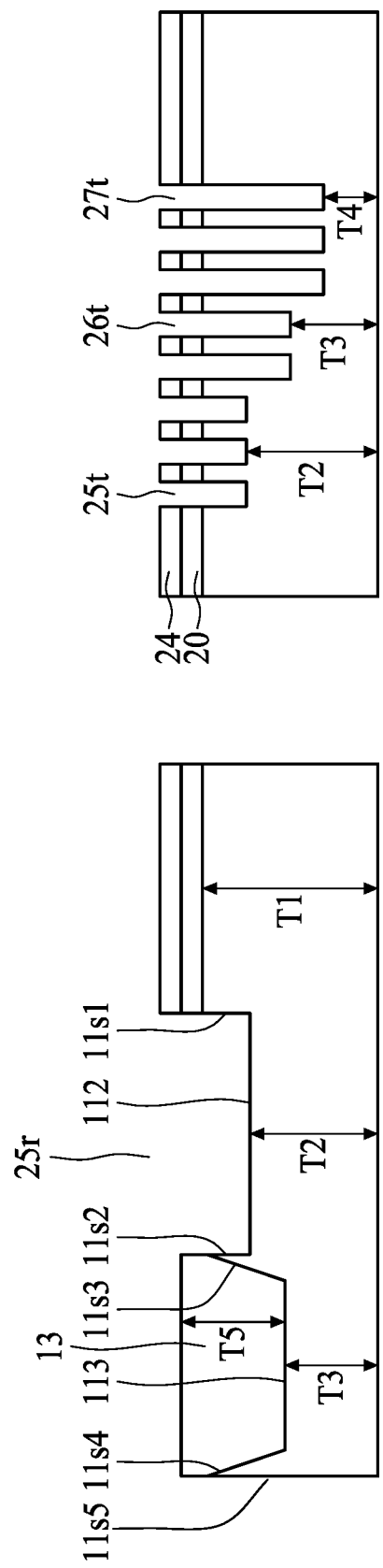

Referring to FIG. 2M, portions of the substrate 11', which are exposed from the photoresist layer 26 and the hard mask layer 13, are etched away.

Figure 2N:
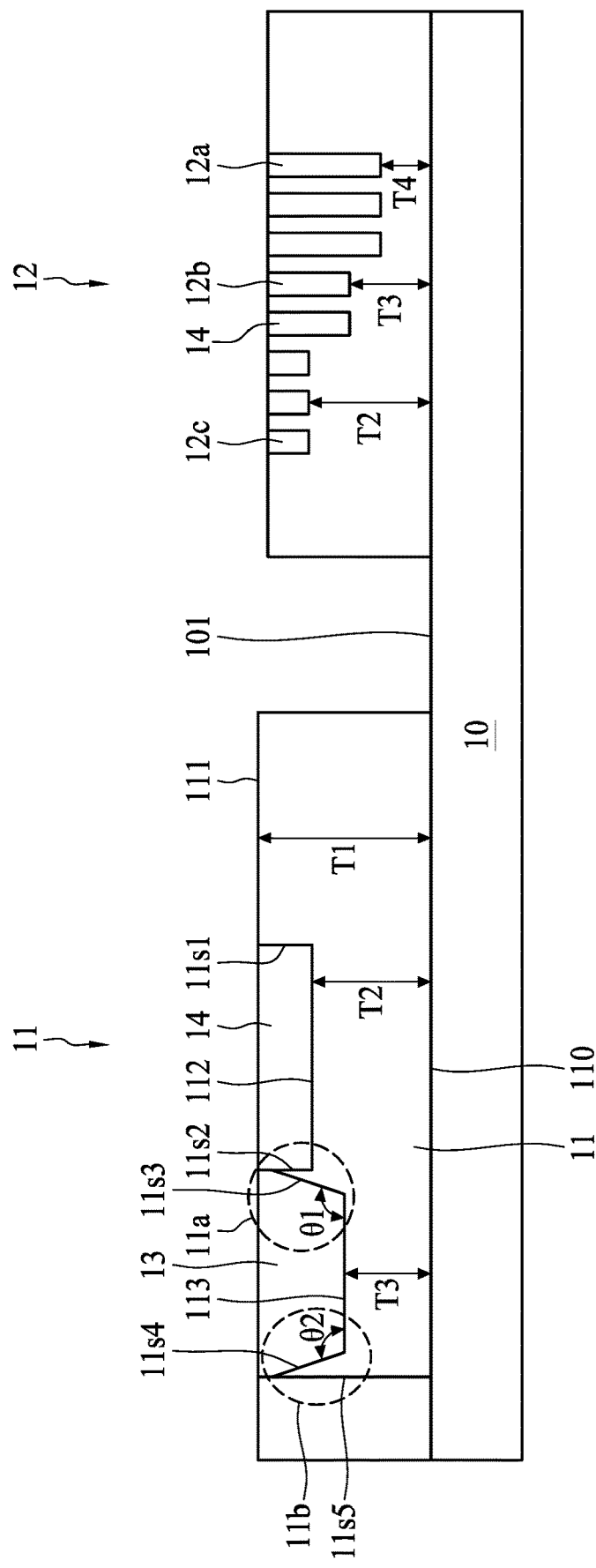

Referring to FIG. 2N, the structure obtained from the operation illustrated in FIG. 2M is disposed on a semiconductor substrate 10. An oxide layer 14 is disposed in the cavity 25r, and the trenches 25t, 26t, and 27t. The oxide layer 14 can be formed by, for example, coating, lamination or other suitable processes. A planarization operation may be performed to planarize a top surface of the had mask layer 13 and the oxide layer 14. The structure obtained through the operations illustrated in FIGS. 2A through 2N may be the same as the semiconductor device package in FIG. 1B.

In some embodiments, after the operation illustrated in FIG. 2M, an etching operation may be performed to remove the hard mask layer 13. The oxide layer 14 is disposed on the surface 113, The structure obtained through the operations illustrated in FIGS. 2A through 2M, and then replacing the hard mask layer 13 with the oxide layer 14 may be the same as the semiconductor device package in FIG. 1C. As a result, a surface roughness of the surface 113 is greater than a surface roughness of the surface 112.

In a comparative embodiment, the optical coupler 11 and the optical coupler 12 may be manufactured separately in different lithographic operations and then picked and placed onto the active surface of the semiconductor substrate 10. For example, the lithographic operations may include forming a photoresist layer, exposing the photoresist layer to a pattern (e.g., a photomask), performing post-exposure bake processes, and developing the photoresist layer to form a patterned photoresist layer. In the comparative embodiment, the optical coupler 11 and the optical coupler 12 may be manufactured separately in each of the operations.

With ever increasing demand in the industry to manufacture low-cost and high-performance optical transceiver modules, there is a continuing trend to use photomasks as little as possible and simplify lithographic operations. However, since photomasks for the optical coupler 11 and the optical coupler 12 have different design rules, it is difficult to integrate the diverse lithographic operations thereof.

Specifically, since the optical coupler 11 and the optical coupler 12 have different shapes and different functions, the photomasks are separately designed and used in different lithographic operations for patterning the optical coupler 11 and the optical coupler 12.

The present disclosure provides an integrating manufacturing process of a semiconductor device package 1, in which optical coupler 11 and optical coupler 12 are manufactured in the same lithographic operation. For example, the optical coupler 11 and the optical coupler 12 can be formed in the same semiconductor substrate, a photoresist layer is formed on the semiconductor substrate in the same operation, the photoresist layer is exposed in the same operation, post-exposure bake processes thereof are performed in the same operation, and the photoresist layer is developed in the same operation.

With the integrated manufacturing, costs can be reduced, and yield increased.

In addition, as mentioned, the critical dimensions of the surfaces 113 and 112 of the optical coupler 11 are defined by a single photomask. The trench 12c of the optical coupler 12 and the surface 112 of the optical coupler 11 are formed in the same etching operation. Therefore, the number of photomasks used is reduced.

Some embodiments of the present disclosure provide a semiconductor device package. The semiconductor device package includes a semiconductor substrate having a first surface and a first optical coupler disposed on the first surface of the semiconductor substrate. The first optical coupler includes a first surface facing away from the first surface of the semiconductor substrate and a first lateral surface connected to the first surface of the first optical coupler. The first surface of the first optical coupler and the first lateral surface of the optical coupler define an angle greater than 90 degrees.

Some embodiments of the present disclosure provide a semiconductor device package. The semiconductor device package includes a semiconductor substrate having a first surface and a first optical coupler disposed on the first surface of the semiconductor substrate. The first optical coupler includes a first surface facing away from the first surface of the semiconductor substrate and a second surface facing away from the first surface of the semiconductor substrate. A distance between the first surface of the first optical coupler and the first surface of the semiconductor substrate being less than a distance between the second surface of the first optical coupler and the first surface of the semiconductor substrate. A central line of the first surface of the first optical coupler is substantially aligned with a central line of the second surface of the first optical coupler.

Some embodiments of the present disclosure provide a method of manufacturing a semiconductor device package. The method includes providing a semiconductor substrate, providing a first photoresist layer on the semiconductor substrate. The method includes etching the semiconductor substrate through the first photoresist layer to form a first opening in the semiconductor substrate. The opening has a bottom surface and a slanted sidewall. The method includes providing a second photoresist layer on the semiconductor substrate and etching the semiconductor substrate through the second photoresist layer to form a second opening in the semiconductor substrate. The method includes forming at least two tapered structures protruded from the bottom surface of the first opening.

The methods and features of the present disclosure have been sufficiently described in the above examples and descriptions. It should be understood that any modifications or changes without departing from the spirit of the present disclosure are intended to be covered in the protection scope of the present disclosure.

Moreover, the scope of the present application in not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, compositions of matter, means, methods or steps. In addition, each claim constitutes a separate embodiment, and the combination of various claims and embodiments are within the scope of the present disclosure.

What is claimed is:

1. A semiconductor device package, comprising:
    a semiconductor substrate having a first surface; and
    a first optical coupler disposed on the first surface of the semiconductor substrate, the first optical coupler including a first surface facing away from the first surface of the semiconductor substrate and a first lateral surface connected to the first surface of the first optical coupler,
    wherein the first surface of the first optical coupler and the first lateral surface of the first optical coupler define an angle greater than 90 degrees,
    wherein the first optical coupler includes a second surface facing away from the first surface of the semiconductor substrate and a tip portion between the first surface and the second surface of the first optical coupler,
    wherein the tip portion is higher than the first surface and the second surface of the first optical coupler with respect to the semiconductor substrate,
    wherein the first surface surrounds the tip portion and the second surface.

2. The semiconductor device package of claim 1, wherein a distance between the first surface of the first optical coupler and the first surface of the semiconductor substrate is less than a distance between the second surface of the first optical coupler and the first surface of the semiconductor substrate.

3. The semiconductor device package of claim 2, wherein the first optical coupler further includes a second lateral surface connected to the first lateral surface and the second surface of the first optical coupler, and the second lateral surface of the first optical coupler is substantially perpendicular to the second surface of the first optical coupler.

4. The semiconductor device package of claim 3, wherein the first lateral surface and the second lateral surface of the first optical coupler define the tip portion.

5. The semiconductor device package of claim 2, wherein a surface roughness of the first surface of the first optical coupler is greater than a surface roughness of the second surface of the first optical coupler.

6. The semiconductor device package of claim 1, wherein a central line of the first surface of the first optical coupler is substantially aligned with a central line of the second surface of the first optical coupler.

7. The semiconductor device package of claim 1, further comprising:
    a hard mask layer in contact with the first surface and the first lateral surface of the first optical coupler.

8. The semiconductor device package of claim 1, further comprising an oxide layer in contact with the first surface and the first lateral surface of the first optical coupler.

9. The semiconductor device package of claim 1, further comprising:
    a second optical coupler disposed on the first surface of the semiconductor substrate, wherein the first optical coupler includes an edge coupler and the second optical coupler includes a grating coupler.

10. The semiconductor device package of claim 9, wherein the second optical coupler includes a first trench and a second trench.

11. The semiconductor device package of claim 1, wherein the tip portion includes a first lateral surface connected to the first surface of the first optical coupler and a second lateral surface connected to the second surface of the first optical coupler, and wherein an angle defined by the first lateral surface of the tip portion and the first surface of the first optical coupler is larger than an angle defined by the second lateral surface of the tip portion and the second surface of the first optical coupler.

12. The semiconductor device package of claim 11, wherein the second lateral surface of the tip portion is substantially perpendicular to the second surface of the first optical coupler.

13. A semiconductor device package, comprising:
    a semiconductor substrate having a first surface and
    a first optical coupler disposed on the first surface of the semiconductor substrate, the first optical coupler including:
        a first surface facing away from the first surface of the semiconductor substrate;
        a second surface facing away from the first surface of the semiconductor substrate; and
        a tip portion between the first surface and the second surface, wherein the tip portion is higher than the first surface and the second surface of the first optical coupler with respect to the semiconductor substrate,
        a distance between the first surface of the first optical coupler and the first surface of the semiconductor substrate being less than a distance between the second surface of the first optical coupler and the first surface of the semiconductor substrate;
    wherein a central line of the first surface of the first optical coupler is substantially aligned with a central line of the second surface of the first optical coupler from a top view,
    wherein the first surface surrounds the tip portion and the second surface.

14. The semiconductor device package of claim 13, wherein the central lines are defined on an imaginary plane substantially parallel to the first surface of the semiconductor substrate.

15. The semiconductor device package of claim 13, wherein the first optical coupler further includes a third surface facing away from the first surface of the semiconductor substrate, the distance between the second surface of the first optical coupler and the first surface of the semiconductor substrate being less than a distance between the third surface of the first optical coupler and the first surface of the semiconductor substrate, wherein the second surface surrounds the third surface.

16. The semiconductor device package of claim 13, wherein the first optical coupler further includes a first lateral surface and a second lateral surface connected to the first surface of the first optical coupler, wherein the first lateral surface and the second lateral surface faces with each other, wherein the first lateral surface and the second lateral surface define an angle greater than 90 degrees with the first surface of the semiconductor substrate, respectively.

17. The semiconductor device package of claim 16, wherein the first optical coupler further includes a third lateral surface connected to the second lateral surface and the second surface of the first optical coupler, and the third lateral surface of the first optical coupler is substantially perpendicular to the second surface of the first optical coupler.

18. The semiconductor device package of claim 17, wherein the second lateral surface and the third lateral surface of the first optical coupler define the tip portion, and the tip portion has a central line substantially aligned with the central line of the second surface of the first optical coupler.

19. The semiconductor device package of claim 13, wherein a surface roughness of the first surface is greater than a surface roughness of the second surface.

20. A semiconductor device package, comprising:
a semiconductor substrate having a first surface; and
a first optical coupler disposed on the first surface of the semiconductor substrate, the first optical coupler including:
- a first surface facing away from the first surface of the semiconductor substrate;
- a second surface facing away from the first surface of the semiconductor substrate; and
- a tip portion between the first surface and the second surface, wherein the tip portion is higher than the first surface and the second surface of the first optical coupler with respect to the semiconductor substrate, wherein a distance between the first surface of the first optical coupler and the first surface of the semiconductor substrate is less than a distance between the second surface of the first optical coupler and the first surface of the semiconductor substrate, and
wherein the first surface surrounds the tip portion and the second surface, and a second optical coupler disposed on the first surface of the semiconductor substrate.

21. The semiconductor device package of claim 20, wherein the first optical coupler includes an edge coupler and the second optical coupler includes a grating coupler.

22. The semiconductor device package of claim 20, wherein the second optical coupler includes a first trench and a second trench.

* * * * *